United States Patent
Agarwal et al.

(10) Patent No.: US 9,589,658 B1
(45) Date of Patent: Mar. 7, 2017

(54) DISTURB FREE BITCELL AND ARRAY

(71) Applicant: GLOBALFOUNDRIES Inc., George Town (KY)

(72) Inventors: Navin Agarwal, Bangalore (IN); Aditya S. Auyisetty, Bengaluru (IN); Balaji Jayaraman, Bangalore (IN); Thejas Kempanna, Bangalore (IN); Toshiaki Kirihata, Poughkeepsie, NY (US); Ramesh Raghavan, Bangalore (IN); Krishnan S. Rengarajan, Bangalore (IN); Rajesh R. Tummuru, Bangalore (IN); Jay M. Shah, Malta, NY (US); Janakiraman Viraraghavan, Bangalore (IN)

(73) Assignee: GLOBALFOUNDRIES INC., George Town (KY)

( * ) Notice: Subject to any disclaimer, the term of this patent is extended or adjusted under 35 U.S.C. 154(b) by 0 days.

(21) Appl. No.: 14/828,770

(22) Filed: Aug. 18, 2015

(51) Int. Cl.
*G11C 16/22* (2006.01)
*G11C 16/34* (2006.01)

(52) U.S. Cl.
CPC .................. *G11C 16/3427* (2013.01)

(58) Field of Classification Search
CPC .................................. G11C 16/3427
USPC ........................................ 365/185.02
See application file for complete search history.

(56) References Cited

U.S. PATENT DOCUMENTS

| | | | |
|---|---|---|---|
| 6,574,140 B2 | 6/2003 | Caywood | |
| 7,032,064 B2 | 4/2006 | Barnett et al. | |
| 8,432,751 B2 | 4/2013 | Hafez et al. | |
| 2004/0032763 A1 | 2/2004 | Chung | |
| 2009/0080246 A1* | 3/2009 | Jenne | G11C 16/3418 365/185.02 |
| 2009/0140313 A1 | 6/2009 | Joo | |
| 2012/0014183 A1* | 1/2012 | Poplevine | G11C 16/0466 365/185.19 |
| 2012/0327714 A1 | 12/2012 | Lue | |
| 2014/0169097 A1 | 6/2014 | Shim | |
| 2014/0328128 A1 | 11/2014 | Louie et al. | |

* cited by examiner

*Primary Examiner* — Huan Hoang
*Assistant Examiner* — Jay Radke
(74) *Attorney, Agent, or Firm* — Anthony Canale; Andrew M. Calderon; Roberts, Mlotkowski, Safran, Cole & Calderon, P.C.

(57) ABSTRACT

Approaches for a memory including a cell array are provided. The memory includes a first device of the cell array which is connected to a bitline and a node and controlled by a word line, and a second device of the cell array which comprises a third device which is connected to a source line and the node and controlled by the word line and a fourth device which is connected between the word line and the node. In the memory, in response to another word line in the cell array being activated and the word line not being activated to keep the first device in an unprogrammed state, the third device isolates and floats the node such that a voltage level of a gate to source of the first device is clamped down by the fourth device to a voltage level around zero volts.

20 Claims, 4 Drawing Sheets

DISTURB FREE BITCELL AND ARRAY

The invention relates to a multiple-time programmable read only memory (MTPROM) cell array which includes a disturb control circuitry, and more particularly, to a MTPROM cell array which includes a disturb control circuitry for avoiding distrub on unprogrammed cells and/or previously programmed cells.

BACKGROUND

In most advanced complementary metal-oxide semiconductor (CMOS) non-volatile memory, hafnium oxide is used as a gate dielectric. Hafnium oxide has a propensity to form oxygen vacancies, where charge trapping produces threshold-voltage (Vt) shifts. A multiple-time programmable read only memory (MTPROM) uses this charge trapping and charge de-trapping behavior in n-type metal-oxide semiconductor field effect transistors (NMOS FET) to store and erase a bit.

To maximize the Vt detection, a memory cell uses a pair of complement NMOS transistor (NMOSc) and true NMOS transistor (NMOSt). In order to store binary data (i.e., "0" and "1"), charge is trapped at the NMOSc and NMOSt gate dielectric of the respective pair. This twin cell approach minimizes sensitivity to Vt fluctuations due to lot, wafer, chip location, and maximizing a differential bit-line voltage (DBL) for sense (i.e., read state).

A NOR-type array is controlled by word-lines (WLs), bit-lines (BLs), and source-lines (SLs) for programming (i.e., charge trapping), reading (i.e., sensing), and resetting (i.e., charge elimination). In the NOR-type array, SLs are common lines which form a meshed source-line network (MSLN) through the entire NOR-type array. As an example, the NOR-type array may be organized as 256 rows and 256 columns, which results in 64 kilobyte density. The rows are controlled by word line (WL) drivers to activate one of the 256 rows for the programming and read modes. A number of parallel writes are fully and flexibly controlled by the WL drivers from 1 to 256 columns at the same time. This flexibility allows parallel write efficiency and the ability to detect each of the NMOS cell's ON current (ION) characteristics by enabling only one out of 64 kilobytes×2 NMOSs. Thus, in the read mode, 64 out of 256 columns are selected by a column select line (CSL). Each CSL is configured in a manner so as to enable reading 64 bits simultaneously.

SUMMARY

In a first aspect of the invention, there is a memory including a cell array which includes a first device of the cell array which is connected to a bitline and a node and controlled by a word line, and a second device of the cell array which includes a third device which is connected to a source line and the node and controlled by the word line and a fourth device which is connected between the word line and the node. In the memory, when another word line in the cell array is being activated, in response to the word line not being activated to keep the first device in an unprogrammed state, the third device isolates and float the node such that a voltage level of a gate to source of the first device is clamped down by the fourth device to a voltage level around zero volts.

In another aspect of the invention, there is a memory including a cell array which includes a first twin cell structure which includes a first device connected to a first bitline and a first node and controlled by a first word line and a second device connected to the first node and a second bitline and controlled by the first word line, a second twin cell structure which includes a third device connected to the first bitline and a second node and controlled by a second word line and a fourth device connected to the second node and the second bitline and controlled by the second word line, and a fifth device connected to a source line and the second node and controlled by the second word line and a sixth device connected between the second word line and the second node. In the memory, when the first line is being activated to program the first device, in response the second word line not being activated to keep the third device and the fourth device in an unprogrammed state, the fifth device isolates and floats the second node such that a voltage level of a gate to source of the third device and the fourth device is clamped down by the sixth device to a voltage level around zero volts.

In another aspect of the invention, there is a memory including a cell array which includes a first device of the cell array which is connected to a bitline and a first node and controlled by a first word line, a second device of the cell array which is connected to the bitline and a second node and controlled by a second word line which is different from the first word line, and a third device of the cell array which is connected to the second node, the second word line, and a source line and is controlled by the second word line. In the memory, when the first line is being activated to program the first device, in response to the second word line not being activated to keep the second device in an unprogrammed state, the third device isolates and floats the second node such that a voltage level of a gate to source of the second device is clamped down by the third device to a voltage level around zero volts.

DETAILED DESCRIPTION

The invention relates to a multiple-time programmable read only memory (MTPROM) cell array which includes a disturb control circuitry, and more particularly, to a MTPROM cell array which includes a disturb control circuitry for avoiding disturb on unprogrammed cells and/or previously programmed cells. In particular, the invention relates to a MTPROM cell comprising a switched source line (SL) coupled to a programmed cell. Switched SL nodes allow isolation of an internal source node VSL from the SL grid in order to avoid the disturb issue on unselected cells. Further, the invention may also be applicable to a One Time Programmable Read Only Memory (OTPM).

In embodiments, a disturb free charge trap memory may comprise a plurality of cells, each having a first device to couple a bitline true (BLT) to the node (e.g., an internal source line node VSL) and a second device to couple the node (e.g., VSL) to a bitline complement (BLC). The first and the second device are controlled by a word line (WL) such that the first device traps the charge by the current flow between the source line and the BL through the first device and a third device when the WL is activated. The third device connects the node VSL to the source line (SL). In embodiments, the first device does not detrap the charge (e.g., erase) by floating the node when the WL is not activated. Additionally, a fourth MOS device configured as a diode, with an anode connected to the node VSL and a cathode as the WL, clamps the floating node to a low voltage level, thus avoiding disturb in unselected cells. Additionally, the bitline complement (BLC) sharing the programmed cell (e.g., BLC0) is driven to 1 V so as to avoid disturb across the cells that share the same column to the programmed cell. Similarly, when the complement NMOS (NMOSc) is getting programmed, the bitline true (BLT) sharing the programmed cell (e.g., BLT0) is driven to 1 volt.

In embodiments, a complement transistor may be in a cell, which is controlled by the WL. A drain node of the cell connects to a node VSL, and a source node of the cell connects to a bitline complement BLC.

Figure 1:
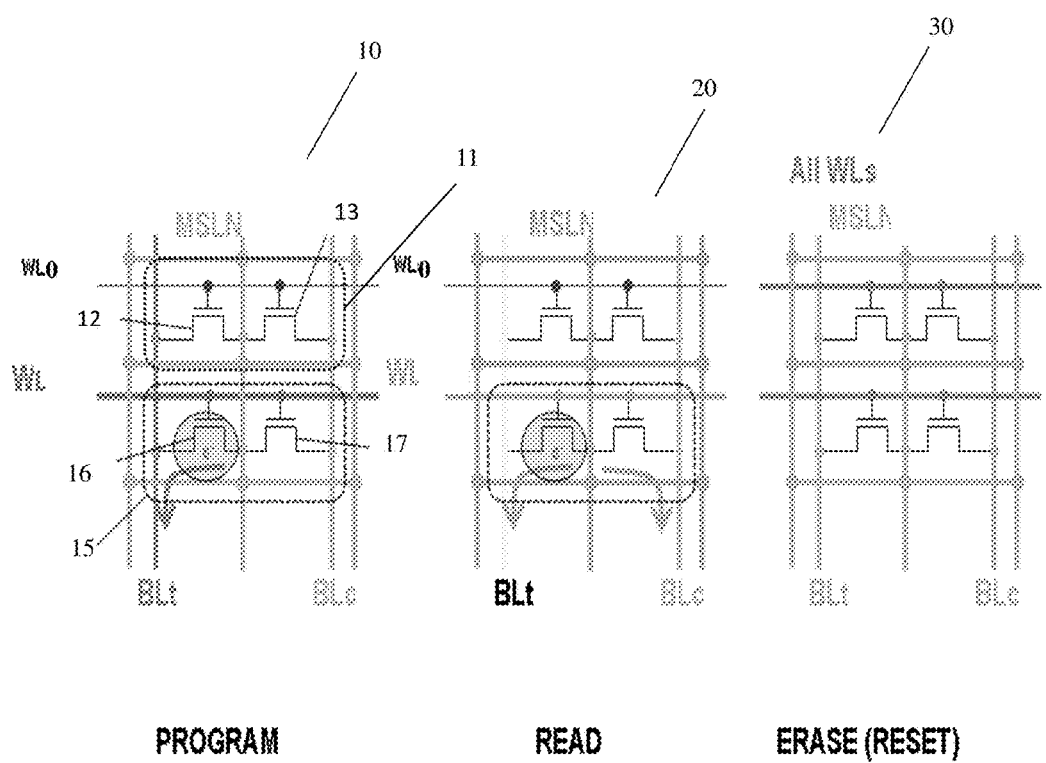
FIG. 1 shows a schematic view of cell arrays.

FIG. 1 shows a schematic view of cell arrays. In an example, FIG. 1 may be a twin-cell MTPROM array with various modes of operation (read, program, and reset). In particular, FIG. 1 shows a programmed cell array 10, a read cell array 20, and an erase/reset cell array 30. As shown in FIG. 1, in the programmed cell array 10, a common source line which forms a meshed source-line network (MSLN) may be set to be 1.5 volts, a first word line WL0 may be set to 0 volts (e.g., WL0 is not set to program), a second word line WL may be set to 2 volts (e.g., WL is set to program), a bitline of a transistor (BLt) is set to be 0 volts, and a bit line of a complementary transistor (BLc) is set to be 1.5 volts. The operating modes of the programmed cell array 10, the read cell array 20, and the erase/reset cell array 30 are shown in Table 1 below.

TABLE 1

| Mode | Word Line (WL) | Bit Line (BL) | Common Source Line (SL) |
|---|---|---|---|
| Stand-By | 0 volts | 1 volt | 1 volt |
| Write/Program | 2 volts | 0 volt | 1.5 volts |
| Erase/Reset | −1 volt | 1.5 volts/Float | 1.5 volts |
| Read/Sense | 1 volt | Signal (ΔBL) | 1 volt |

In the programmed cell array 10 of FIG. 1, a selected NMOS pair 15 has the second word line WL voltage (e.g., 2 volts) applied to it. Further, in a first transistor 16 of the selected NMOS pair 15, as a BLt is set to be 0 volts, the voltage from gate to source (Vgs) of the first transistor is 2 volts, and the voltage from drain to source (Vds) of the first transistor is 1.5 volts. As a second transistor 17 of the selection NMOS pair 15 has a BLc set to be 1.5 volts, the Vgs of the second transistor 17 is 0.5 volts and the Vds of the second transistor 17 is 0 volts. Therefore, only the first transistor 16 of the selected NMOS pair 15 is programmed according to Table 1.

In FIG. 1, an unselected NMOS pair 11 has the first word line WL applied to it. Further, in a first transistor 12 of the unselected NMOS pair 11, as the BLt is set to be 0 volts, the Vgs of the first transistor is 0 volts and the Vds of the first transistor is 1.5 volts. As a second transistor 13 of the unselected NMOS pair 11 has a BLc set to be 1.5 volts, the Vgs of the second transistor 13 is −1.5 volts and the Vds of the second transistor 13 is 0 volts.

In the second transistor 13 of the unselected NMOS pair 11, the Vgs of −1.5 volts produces a reverse electric field, which will cause charge loss or detrapping from the gate and cause a charge to go back to the channel. This causes a disturb issue, in which the second transistor 13 of the unselected NMOS pair 11 is weakly erased, which may cause data corruption. Also, the charge may cause current to tunnel into nearby cells, which results in degradation and data corruption of nearby cells.

Moreover, in order to program the programmed cell array 10, an elevated voltage is needed on the MSLN to generate hot electrons for trapping in gate oxide with high gate/source electric field. Thus, it is not feasible to reduce MSLN voltage to reduce the disturb issue because this will affect programming margins.

Figure 2:
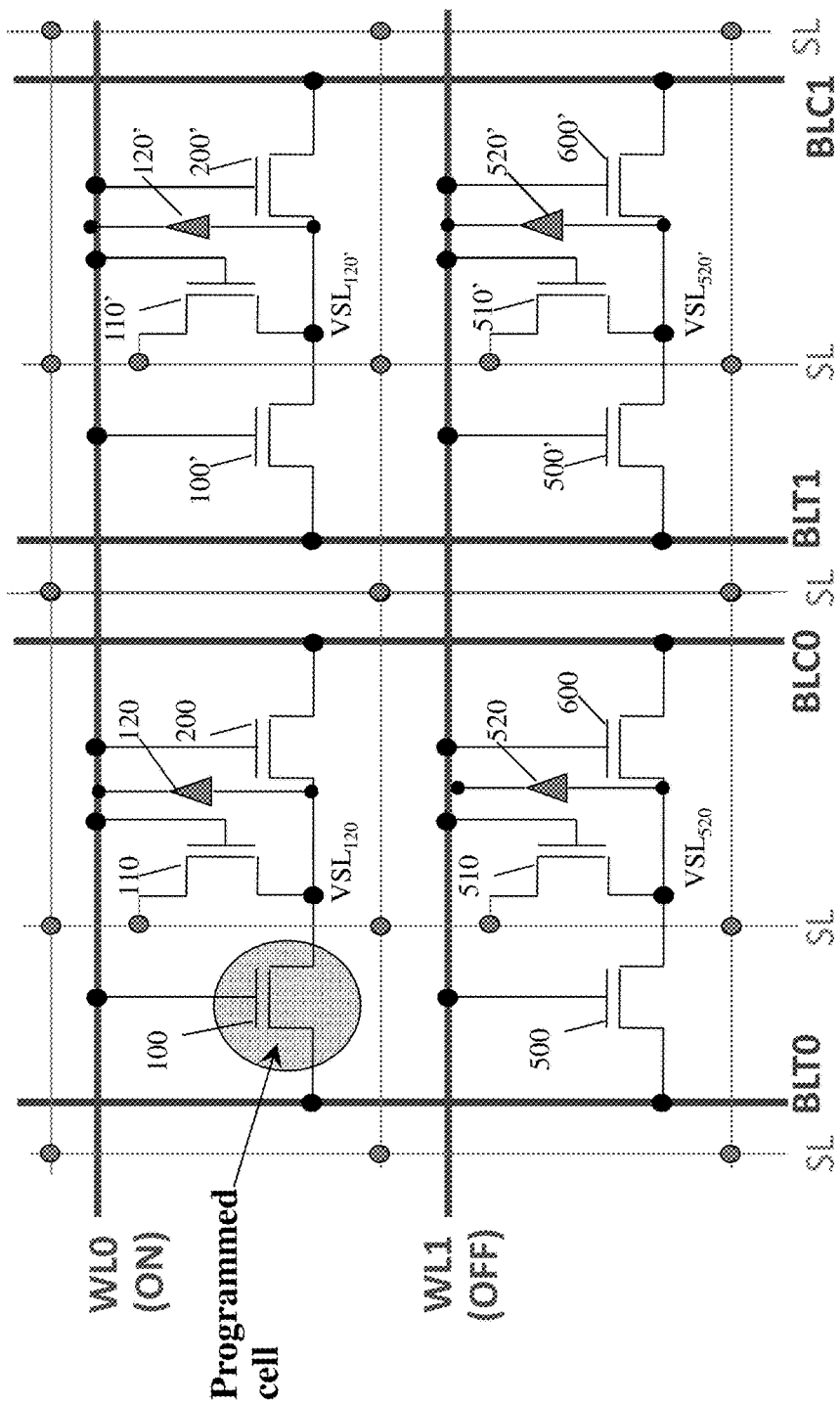
FIG. 2 shows a schematic view of a cell array in accordance with aspects of the invention.

FIG. 2 shows a schematic view of a cell array in accordance with aspects of the invention. In an example, FIG. 2 may be a disturb-free MTPROM cell array. In FIG. 2, a first word line WL0 is programmed at 2 volts and read at 1 volt (e.g., 2V/1V). Further, a second word line WL1 is in a standby state (e.g., not in a program, read, or erase state) of 0 volts. A bitline of a transistor BLT0 is set to 0 volts in a program mode and is used for data sensing in a read mode (0V/Sense) and a bitline of a complement transistor BLC0 is set to 1 volt in the program mode and is used for data sensing in the read mode (1V/Sense). Further, another bitline of a transistor BLT1 is set to be 1 volt in a program mode and is used for data sensing in the read mode (1V/Sense) and another bitline of a complement transistor BLC1 is set to 1 volt in the program mode and is used for data sensing in the read mode (1V/Sense). The meshed source-line network (MSLN) or SL may be set to 2 volts in the program mode and 1 volt in the read mode (2V/1V). The operating modes of the cell array in FIG. 2 are shown below in Table 2.

TABLE 2

| Mode | WL | Common SL | VSL node for Selected Cell | Bit Line (BLt) for Selected Column | Bit Line (BLc) for Selected Column | Bit Line (BLt) for Unselected Column | Bit Line (BLc) for Unselected Column | VSL node for Unselected Cell |
|---|---|---|---|---|---|---|---|---|
| Program (Selected Row) | 2 Volts | 2 Volts | 1.5 Volts | 0 Volts | 1 Volt | 1 Volt | 1 Volt | Potential Divider |
| Program (Unselected Row) | 0 Volts | 2 Volts | Float | 0 Volts | 1 Volt | 1 Volt | 1 Volt | Float |
| Erase/Reset | −1 Volt | −1 Volt | Float | 1 volt | 1 Volt | 1 Volt | 1 Volt | Float |
| Read/Sense | 1 Volt | 1 Volt | Sense | Sense | Sense | 0 Volts | 0 Volts | Float |

As shown in Table 2, in an erase mode, the bitline is raised to a high voltage (e.g., 1 volt) and $VSL_x$ for both the selected and unselected cells is left floating. Further, in the read mode, a sensing margin may degrade due to the addition of the disturb control circuitry. Therefore, yield needs to be guaranteed even at low supply voltages.

In FIG. 2, transistors 100, 100', 200, 200', 500, 500', 600, and 600' are part of the cell array. Further, each pair of transistors (e.g., transistors 100 and 200) has a disturb control circuit (e.g., transistor 110 and diode 120, which correspond to transistors 100 and 200). The disturb control circuitry for all of the transistors 100-600' comprises transistor 110, diode 120, transistor 110', diode 120', transistor 510, diode 520, transistor 510', and diode 520', respectively.

As shown in FIG. 2, there is disturb control circuitry (e.g., transistor 510 and diode 520) for each cell of the array. Using the disturb control circuitry (i.e., transistors 110, 110', 510, 510' and diodes 120, 120', 520, 520'), adds to silicon area.

In FIG. 2, the transistor 100 is a programmed cell due to Vgs of the transistor 100 being 2 volts and Vds being 1.5 volts. Even though the common source line SL is set at 2 volts during programming, the voltage at $VSL_{120}$ is approximately 1.5 volts due to a potential divider action between the transistor 100 and a source line switch of the transistor 110. In the device, 1.5 volts is required at $VSL_{120}$ for programming transistor 100. $VSL_x$ can be generally approximated by equation 1 below.

$$VSL_x = K*SL \quad \text{(equation 1)},$$

where K is a constant less than 1 that accounts for the potential divider action between the transistor 100 and a source line switch of the transistor 110, SL is a voltage of the common source line, and x is a specific node in the array cell. If $VSL_{120}$ is 1.5 volts, then K=0.75.

In FIG. 2, transistor 500 is not a programmed cell because WL1 is 0 volts. Therefore, if there was no disturb control circuitry (e.g., no transistor 510 and no diode 520), Vgs would drift towards −1.5 volts and there would be a disturb issue causing data corruption (same disturb issue previously discussed in FIG. 1). However, due to the presence of the transistor 510 and diode 520, $VSL_{520}$ gets clamped to a voltage that is close to ground.

In embodiments, the transistor 510 of the disturb control circuitry acts to isolate the SL of the cell. Also, the diode 520 can then be used to clamp down the −1.5 volts drift voltage Vgs to a voltage slightly above the WL1 voltage level (e.g., clamp down −1.5 volts drift voltage Vgs to a voltage level ranging from −0.2 volts to −0.3 volts). Therefore, the transistor 510 and diode 520 of the disturb control circuitry help to control the disturb issue during programming. In FIG. 2, when using the disturb control circuitry (e.g., transistor 510 and diode 520), data corruption and weak erase are prevented.

In FIG. 2, transistors 110, 110', 510, and 510' of the disturb control circuitry allow for isolation of the SL of particular cells. Therefore, a voltage of the source line at different points of the grid ($VSL_{120}$, $VSL_{120'}$, $VSL_{520}$, and $VSL_{520'}$) can be floated using transistors 110, 110', 510, and 510' of the disturb control circuitry when that particular cell is not programmed. Thus, by isolating the source line SL for different cells and clamping down the voltage of nonprogrammed cells, the disturb issue can be prevented.

In FIG. 2, although transistor 500 is used as an example of an unprogrammed cell in which a transistor has its voltage Vgs clamped down, the disturb control circuitry (e.g., 110, 120, 110', 120', 510, 520, 510', 520') can be applied to any unprogrammed transistor in the cell array of the semiconductor memory to clamp down its corresponding voltage Vgs. Also, although there may be a tradeoff between reducing parasitic current and reducing the disturb issue, it has been found that driving a bitline to 1 volt will reduce disturb/data corruption in nonprogrammed cells without excessive parasitic current.

Figure 3:
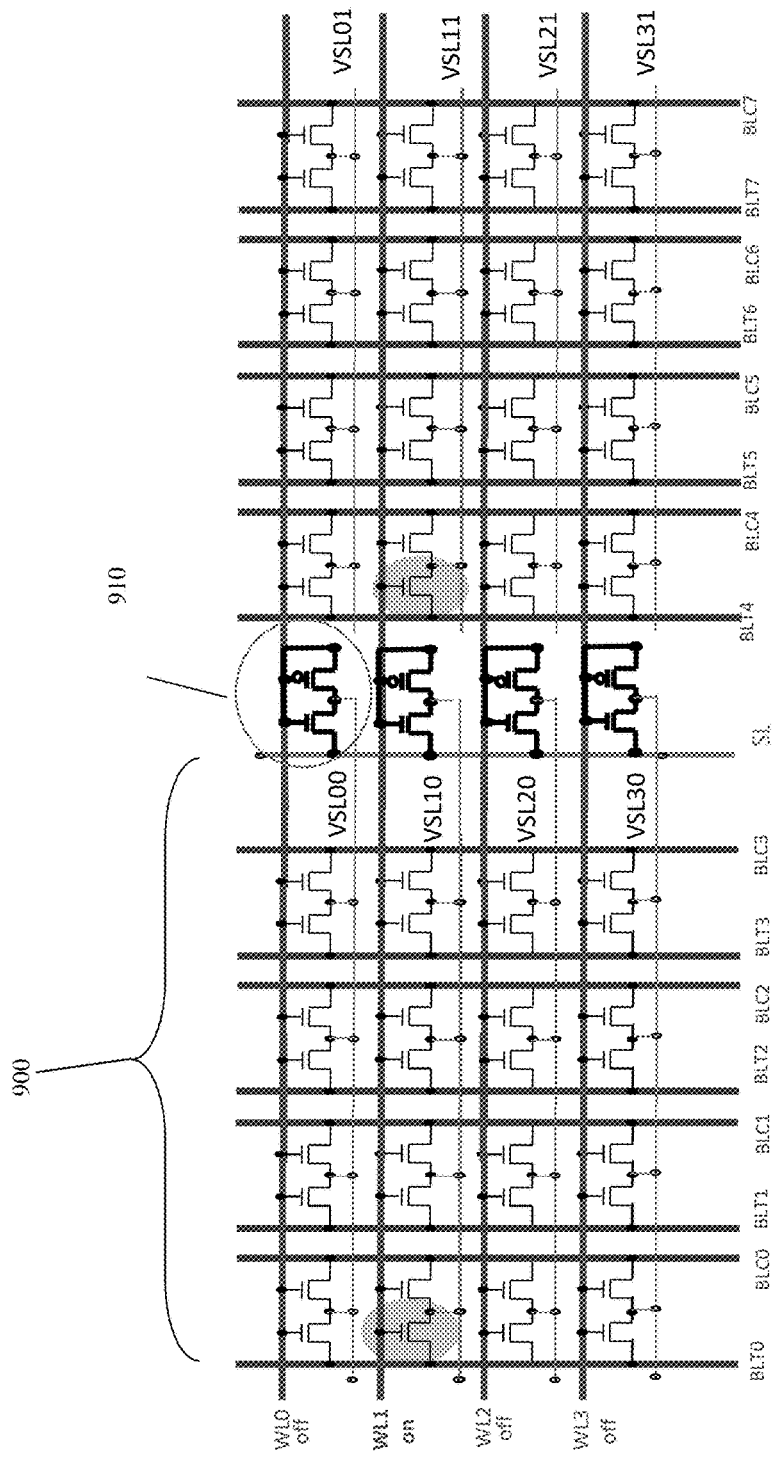
FIG. 3 shows a schematic view of another cell array in accordance with aspects of the invention.

FIG. 3 shows a schematic view of another cell array in accordance with aspects of the invention. In an example, FIG. 3 may be a MTROM cell array with an amortized disturb-control circuit. In particular, in FIG. 3, the overhead of a disturb control circuitry is minimized. In FIG. 3, an array cell 900 includes a pair of transistors (e.g., twin cells) in each cell. As shown in the array cell 900, four columns of twin cells are tied to a common node VSL00 for connecting to a disturb circuitry 910. As an example, cells connected between WL1 and BLT0 and BLT4 are considered to be programmed by biasing WL1 at 2 volts and BLT0 and BLT4 at 0 volts. The nodes VLS10 and VLS11 settle to around 1.5 volts. Further, BLC0, BLT1, BLC1, BLT2, BLC2, BLT3, BLC3, BLC4, BLT5, BLC5, BLT6, BLC6, BLT7, and BLC7 are held at 1 volt while cells connected between BLT0 and BLT4 and WL1 are being programmed. Further, SL WL, VSL10, and VS11 have a program/read voltage of 2 volts/1 volt. Further, WL0, WL2, and WL3 are 0 volts (i.e., standby, nonprogrammed state). The nodes VSL00, V5L01, VSL11, V5L20, VSL 21, V5L30, and V5L31 are clamped to a voltage close to ground (0.2 volts to 0.3 volts).

In embodiments, the disturb circuitry 910 comprises a NMOS transistor and a PMOS transistor in a configuration which acts as a diode. Thus, the disturb circuitry 910 is configured to clamp down the drift voltage to a voltage slightly above the WL1 voltage level (e.g., clamp down to a voltage level ranging from −0.2 volts to −0.3 volts) for a nonprogrammed row in the array cell 900. In this way, the cell array 900 and the disturb circuitry 910 control the disturb issue during programming over multiple columns, while still being able to minimize the overhead of the disturb control circuitry.

In FIG. 3, the array cell 900 is shown as four columns of twin cells before the disturb circuitry 910. However, it should be understood by those of ordinary skill in the art that four columns (M=4) of twin cells is just an example, and the number of twin cells could be any number of M columns of twin cells, depending on the semiconductor device and the application (M being a number greater than one).

Figure 4:
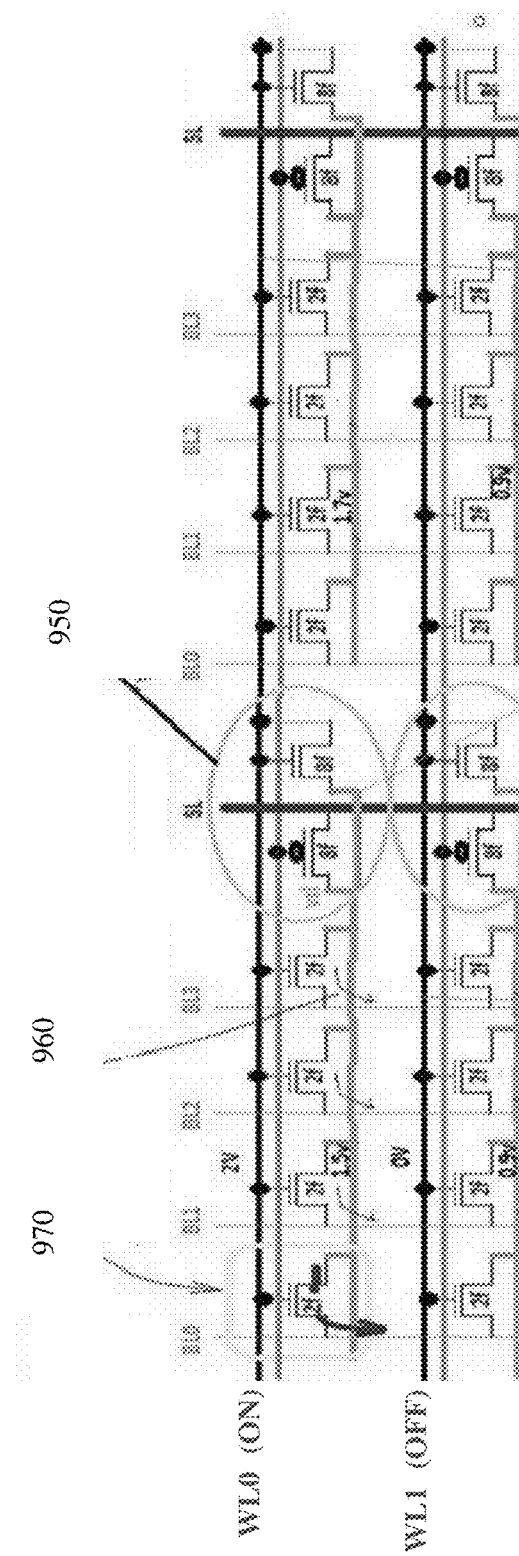
FIG. 4 shows a schematic view of another cell array of another semiconductor device in accordance with aspects of the invention.

FIG. 4 shows a schematic view of another cell array in accordance with aspects of the invention. In an example, FIG. 4 may be a disturb-free open-bitline architecture (OBA). In FIGS. 2-3, a $VSL_x$ for a node x is calculated as K*SL in Equation 1; whereas, in FIGS. 2-3, K (e.g., constant due to variations) could be less than 0.5, which makes efficiency lower and the voltage $VSL_x$ too low of a level for programming. Therefore, FIG. 4 shows another embodiment in which SL and WL voltages are set to be higher values and disturb is still prevented.

In particular, FIG. 4 shows a disturb free open bitline architecture in which, during programming, for example, WL0 is 2 volts, WL1 is 0 volts, SL is 2 volts, BL0 is 0 volts, and BL1-BL3 is 1 volt. Also, the architecture of FIG. 4 is a single cell (instead of a twin cell architecture discussed in FIGS. 2-3). In FIG. 4, VSL for a programmed cell is approximately 1.5 V and VSL for an unprogrammed cell is 0.2 volts to 0.3 volts.

As shown in FIG. 4, disturb control circuit 950 is placed after four columns of single cells. However, four columns (M=4) of single cells is just an example, and one of ordinary skill in the art would understand that the number of single cells could be any number of M columns of single cells. For example, in an alternative embodiment, eight columns (M=8) of single cells could be used in the array before the disturb circuitry 950 is placed.

In FIG. 4, a parasitic current path 960 exists to 1 volt half selected bitlines. Further, only one programmed cell 970 of the first four column cells is programmed. Therefore, the programming frequency is one in every four cells. However, if eight columns (M=8) are used, the programming frequency is one in every 8 cells, which improves area density of memory.

The above-discussed disturb-free architecture is applicable for elevated source line (ESL) architecture (i.e., Source line (SL) is held at a high voltage (non-zero) during programming/read). However, disturb can be avoided in Grounded Source Line (GSL) architecture (SL is grounded) with slight modification in the voltage conditions. In GSL twin-transistor architecture, SL is grounded, BLT is driven to 1.5V and BLC is grounded during programming. In this case, the disturb is limited to only one column. Further, to avoid disturb in this column, we could apply 0.5V on the WLs of all unprogrammed rows. The BL driver is sized appropriately so as to supply the parasitic currents that the unprogrammed transistors in the column would sink. This would not need additional disturb-control circuitry.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory including a cell array, comprising:
    a first device of the cell array which is connected to a bitline and a node and controlled by a word line; and
    a second device of the cell array which comprises a third device which is connected to a source line and the node and controlled by the word line and a fourth device which is connected between the word line and the node,
    wherein, when another word line in the cell array is being activated, in response to the word line not being activated to keep the first device in an unprogrammed state, the third device isolates and floats the node such that a voltage level of a gate to source of the first device is clamped down by the fourth device to a voltage level around zero volts.

2. The memory of claim 1, wherein the first device and the third device of the cell array are NMOS transistors, and the fourth device is one of a diode and a PMOS transistor.

3. The memory of claim 1, wherein the source line is a common source line which forms a meshed source-line network.

4. The memory of claim 1, wherein the voltage level of the gate to source of the first device being clamped down by the fourth device prevents a program disturb issue in an unprogrammed cell containing the first device and the second device.

5. The memory of claim 1, wherein the bitline is not activated.

6. The memory of claim 1, wherein the cell array is a multiple time programmable memory array.

7. A memory including a cell array, comprising:
    a first twin cell structure which comprises a first device connected to a first bitline and a first node and controlled by a first word line and a second device connected to the first node and a second bitline and controlled by the first word line;
    a second twin cell structure which comprises a third device connected to the first bitline and a second node and controlled by a second word line and a fourth device connected to the second node and the second bitline and controlled by the second word line; and
    a fifth device connected to a source line and the second node and controlled by the second word line and a sixth device connected between the second word line and the second node,
    wherein, when the first line is being activated to program the first device, in response to the second word line not being activated to keep the third device and the fourth device in an unprogrammed state, the fifth device isolates and floats the second node such that a voltage level of a gate to source of the third device and the fourth device is clamped down by the sixth device to a voltage level around zero volts.

8. The memory of claim 7, wherein the first device and the second device are a first pair of complementary transistors, and the third device and the fourth device are a second pair of complementary transistors.

9. The memory of claim 7, wherein the first device, the second device, the third device, and the fourth device, and the fifth device are NMOS transistors, and the sixth device is a diode.

10. The memory of claim 7, wherein the source line is a common source line which forms a meshed source-line network.

11. The memory of claim 7, wherein the source line is set to a voltage value greater than or equal to two volts in order to ensure that the first device is programmed.

12. The memory of claim 7, wherein the voltage level of the gate to source of the third device and the fourth device being clamped down by the sixth device prevents a program disturb issue in an unprogrammed cell containing the third device and the fourth device.

13. The memory of claim 7, wherein the first bitline value is not activated and the second bitline is activated.

14. The memory of claim 13, wherein the second bitline is activated to a voltage level higher than one volt in order to reduce parasitic current.

15. The memory of claim 7, wherein the cell array is a multiple time programmable memory array.

16. A memory including a cell array, comprising:
a first device of the cell array which is connected to a bitline and a first node and controlled by a first word line;
a second device of the cell array which is connected to the bitline and a second node and controlled by a second word line which is different from the first word line; and
a third device of the cell array which is connected to the second node, the second word line, and a source line and is controlled by the second word line,
wherein, when the first line is being activated to program the first device, in response to the second word line not being activated to keep the second device in an unprogrammed state, the third device isolates and floats the second node such that a voltage level of a gate to source of the second device is clamped down by the third device to a voltage level around zero volts.

17. The memory of claim 16, wherein the third device comprises a PMOS transistor and a NMOS transistor and is configured to act as a diode.

18. The memory of claim 16, wherein the source line is a common source line which forms a meshed source-line network.

19. The memory of claim 16, wherein the voltage level of the gate to source of the second device being clamped down by the third device prevents a program disturb issue in an unprogrammed cell containing the second device.

20. The memory of claim 16, wherein the first bitline value is not activated and the second bitline is activated.

* * * * *